(12) United States Patent
Fricker

(10) Patent No.: US 10,440,860 B2
(45) Date of Patent: Oct. 8, 2019

(54) THERMAL MANAGEMENT VIA ACTIVE SURFACES

(71) Applicant: EMC Corporation, Hopkinton, MA (US)

(72) Inventor: Jean-Philippe Fricker, Mountain View, CA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 160 days.

(21) Appl. No.: 14/871,592

(22) Filed: Sep. 30, 2015

(65) Prior Publication Data

US 2017/0094834 A1    Mar. 30, 2017

(51) Int. Cl.
| | |
|---|---|
| *H05K 7/20* | (2006.01) |
| *H01L 23/467* | (2006.01) |
| *F04B 45/04* | (2006.01) |
| *F04D 33/00* | (2006.01) |
| *G06F 1/20* | (2006.01) |
| *F04B 35/04* | (2006.01) |
| *F04B 45/047* | (2006.01) |

(52) U.S. Cl.
CPC ......... *H05K 7/20563* (2013.01); *F04B 35/04* (2013.01); *F04B 45/04* (2013.01); *F04B 45/045* (2013.01); *F04B 45/047* (2013.01); *F04D 33/00* (2013.01); *G06F 1/20* (2013.01); *H01L 23/467* (2013.01)

(58) Field of Classification Search
CPC ............ B81B 7/0093; B81B 2201/036; B81B 2201/058; B81B 2203/0127; H05K 7/20145; H05K 7/20154; H05K 7/20563; H01L 23/46; H01L 23/467; H01L 23/4735; F28F 13/02; F28F 13/12; F04B 43/043; F04B 43/046; F04B 45/047

See application file for complete search history.

(56) References Cited

U.S. PATENT DOCUMENTS

| | | | | |
|---|---|---|---|---|
| 5,063,476 A * | 11/1991 | Hamadah | ............ | H01L 23/467 257/E23.099 |
| 5,361,188 A * | 11/1994 | Kondou | ................ | H01L 23/467 165/104.34 |
| 5,889,651 A * | 3/1999 | Sasaki | .................. | H01L 23/467 165/908 |
| 7,336,486 B2 * | 2/2008 | Mongia | ................. | H01L 23/467 165/104.33 |

(Continued)

FOREIGN PATENT DOCUMENTS

TW    201137237 A1    1/2011

OTHER PUBLICATIONS

First Office Action issued in corresponding CN application No. 201511024200.1 dated May 30, 2018 (17 pages).

*Primary Examiner* — Paul Alvare
*Assistant Examiner* — Hans R Weiland
(74) *Attorney, Agent, or Firm* — Chamberlain, Hrdlicka, White, Williams & Aughtry

(57) ABSTRACT

A system for thermal management of a heat sink via active surfaces. The heat sink includes a cavity within the heat sink, and a nozzle. The nozzle provides a pathway from the cavity to a surface of the heat sink. The heat sink also includes a membrane attached to the cavity and an actuator of the membrane, causing the membrane to oscillate. The oscillation of the membrane causes inflow and outflow of a medium through the nozzle.

16 Claims, 7 Drawing Sheets

(56) References Cited

U.S. PATENT DOCUMENTS

| | | | | |
|---|---|---|---|---|
| 7,990,705 B2* | 8/2011 | Bult | ................... | H01L 23/4735 |
| | | | | 165/80.2 |
| 8,081,454 B2* | 12/2011 | Ishikawa | ............... | H01L 23/467 |
| | | | | 165/122 |
| 8,418,934 B2* | 4/2013 | Arik | ..................... | H01L 23/467 |
| | | | | 239/102.2 |
| 8,696,329 B2* | 4/2014 | Busch | ................... | F04B 43/043 |
| | | | | 417/413.1 |
| 2005/0111185 A1* | 5/2005 | Bhattacharya | ..... | H05K 7/20009 |
| | | | | 361/690 |
| 2011/0259557 A1* | 10/2011 | Chao | .................... | H01L 23/467 |
| | | | | 165/121 |
| 2014/0036435 A1* | 2/2014 | Kim | ......................... | G06F 1/20 |
| | | | | 361/679.33 |

\* cited by examiner

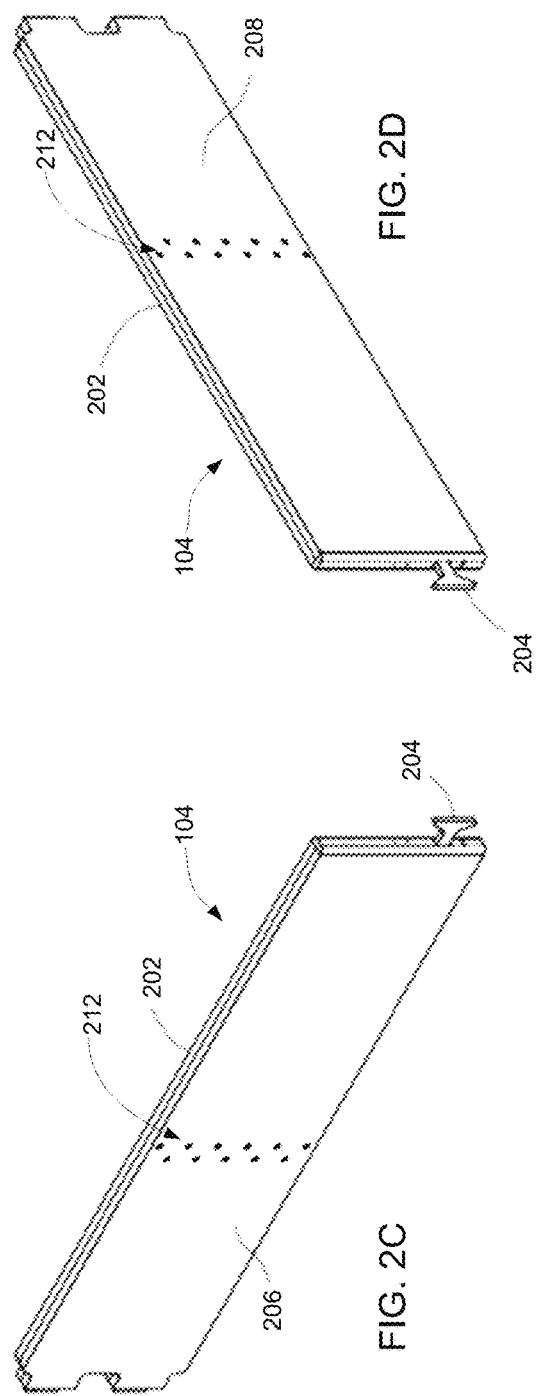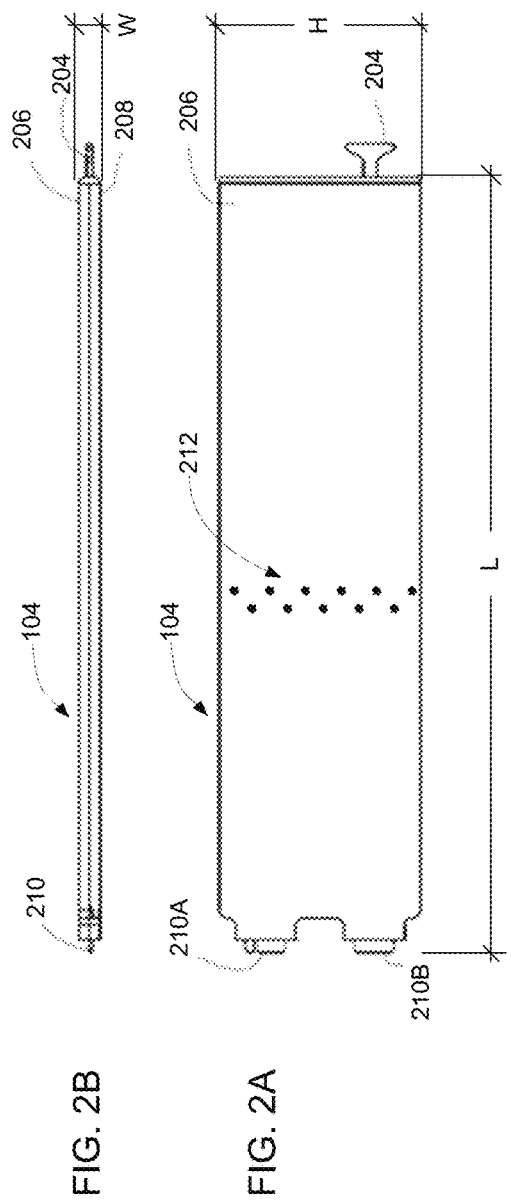

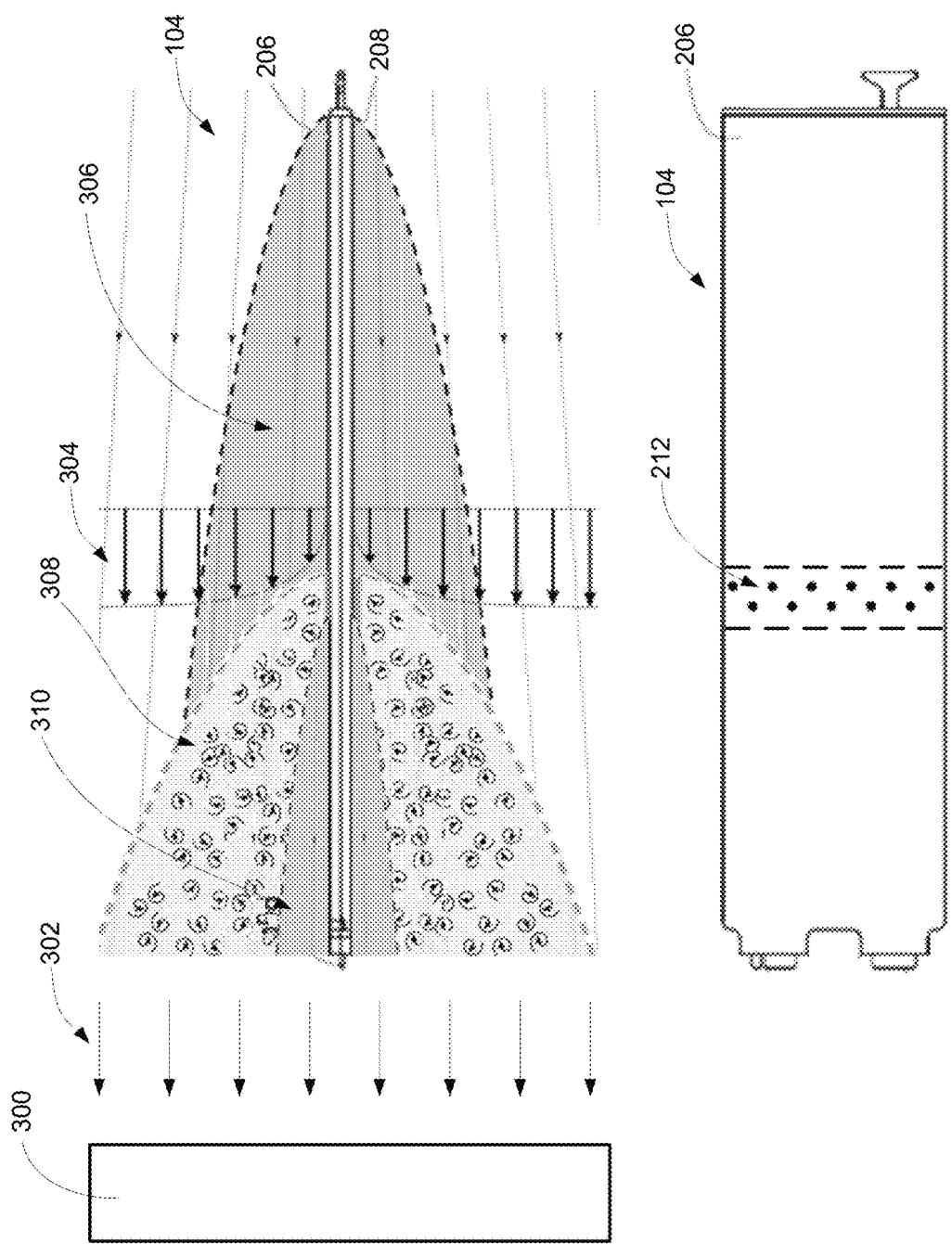

THERMAL MANAGEMENT VIA ACTIVE SURFACES

BACKGROUND

Electronic components may generate heat that may need to be removed. Convection may be a mechanism to transport the heat away from the electronic components.

BRIEF DESCRIPTION OF DRAWINGS

FIGS. 2A-3B show multiple views of a solid state storage module in accordance with one or more embodiments of the technology.

DETAILED DESCRIPTION

Figure 1A:
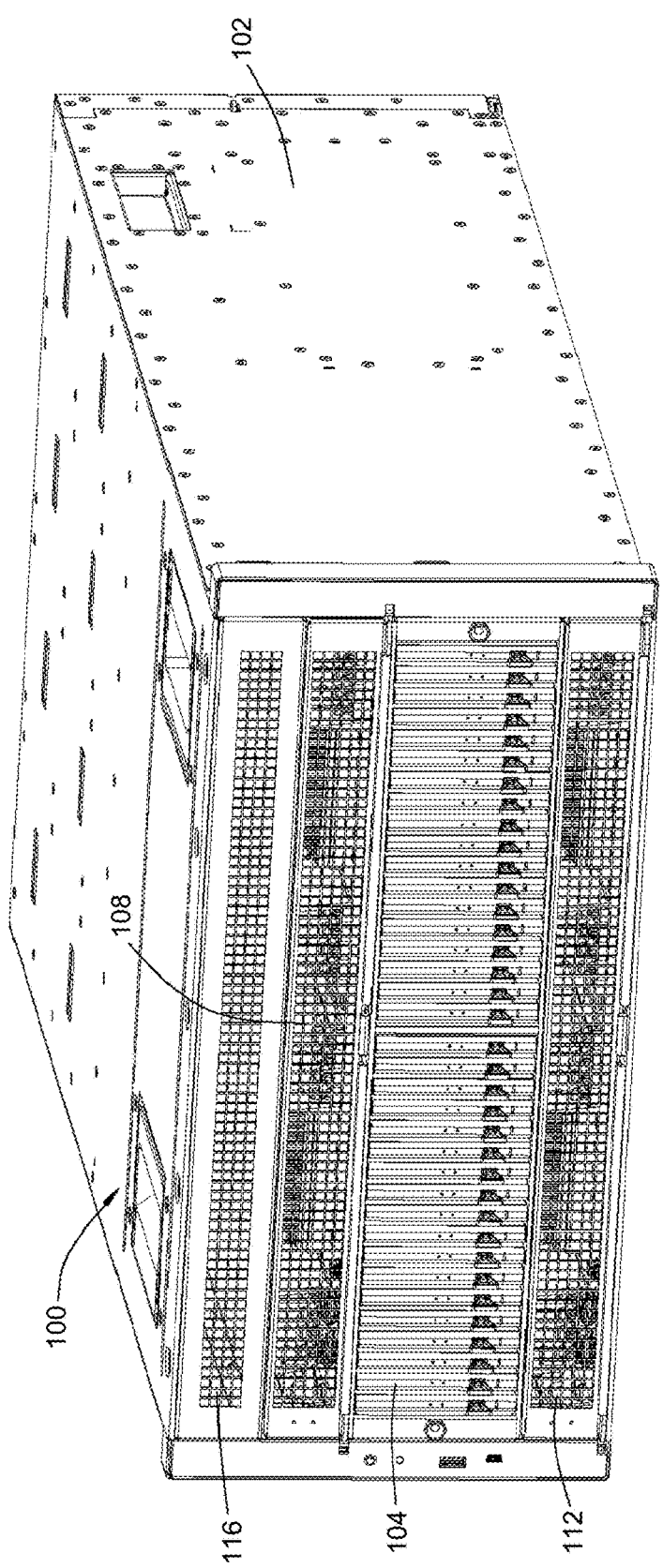
FIG. 1A shows a perspective view of a storage assembly in accordance with one or more embodiments of the technology.

Specific embodiments of the technology will now be described in detail with reference to the accompanying figures. Like elements in the various figures are denoted by like reference numerals for consistency.

In the following detailed description of embodiments of the technology, numerous specific details are set forth in order to provide a more thorough understanding of the technology. However, it will be apparent to one of ordinary skill in the art that the technology may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

In the following description of FIGS. 1A-5B, any component described with regard to a figure, in various embodiments of the technology, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the technology, any description of the components of a figure is to be interpreted as an optional embodiment which may be implemented in addition to, in conjunction with, or in place of the embodiments described with regard to a corresponding like-named component in any other figure.

In general, embodiments of the technology are directed to methods and systems for thermal management via active surfaces. More specifically, one or more embodiments disclosed herein may be directed to one or more components of a system that enable heat removal from surfaces. Heat may be generated, for example, by electronic components such as integrated circuits, light emitting diodes (LEDs), solid state storage modules, etc. These electronic components may generate heat and may require cooling in order to ensure proper functioning, and to avoid damage. These electronic components may therefore be in surface contact with thermally conductive materials, designed to conduct heat away from the electronic components. In one or more embodiments of the technology, the thermally conductive materials include one or more surfaces suitable for the emission of the thermal energy into a surrounding medium, e.g., via convection. The surrounding medium may be, for example, air or water (or any other fluid). To increase the thermal energy that may be removed from the surface of the thermally conductive material, the surrounding medium may be moved continuously, for example, using a fan that causes a continuous airflow over the surface of the thermally conductive material. Fluid dynamics may govern the behavior of the medium moving over the surface of the thermally conductive material, e.g. the velocity of the medium in the vicinity of the surface, and whether the movement of the flow of the medium along the surface is laminar or turbulent. Generally, a higher velocity of a medium may result in an increased heat removal via convection, whereas a lower velocity of the same medium may result in reduced heat removal via convection.

Although one or more of these embodiments may be preferred, the embodiments disclosed should not be interpreted, or otherwise used, as limiting the scope of the disclosure, including the claims. In addition, those skilled in the art will appreciate that the following technology has broad application, and the discussion of any embodiment is meant only to be exemplary of that embodiment, and not intended to suggest that the scope of the disclosure, including the claims, is limited to that embodiment.

One or more aspects of the technology is directed to a method of heat removal from solid state memory modules in a storage assembly system.

Certain terms are used throughout the following description and claims to refer to particular features or components. As those skilled in the art will appreciate, different persons may refer to the same feature or component by different names. This document does not intend to distinguish between components or features that differ in name but not function. The figures are not necessarily to scale. Certain features and components herein may be shown exaggerated in scale or in somewhat schematic form and some details of conventional elements may not be shown in interest of clarity and conciseness.

Figure 1B:
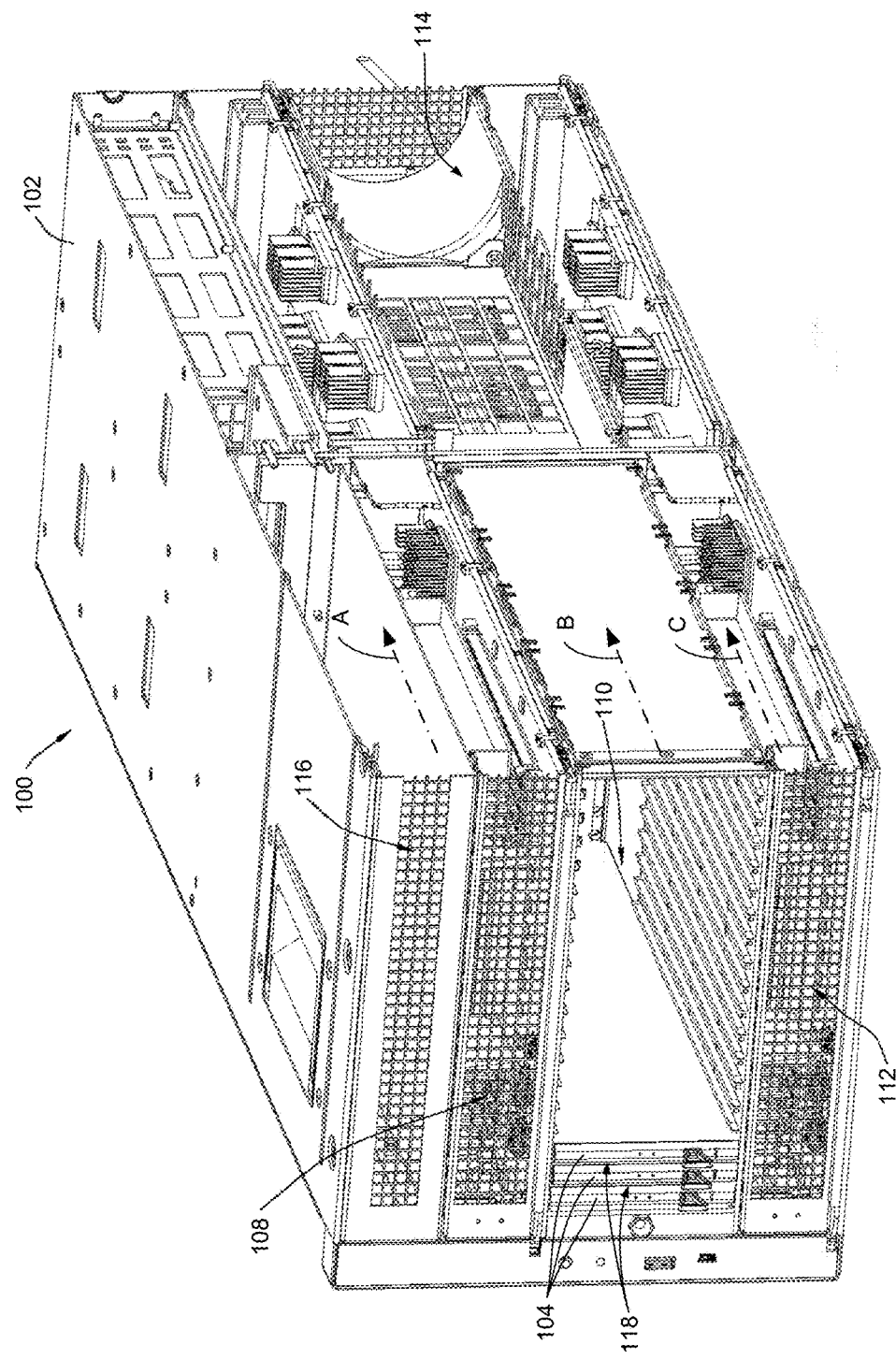
FIG. 1B shows a cross-sectional perspective view of a storage assembly in accordance with one or more embodiments of the technology.

Referring to FIGS. 1A and 1B, multiple views of a storage assembly system (100), in accordance with one or more embodiments of the technology, are shown. FIG. 1A shows a perspective view of the storage assembly system (100) and FIG. 1B shows a cross-sectional perspective view of the partially assembled storage assembly system (100).

In one or more embodiments of the technology, the storage assembly system (100) may include a chassis (102), in which one or more components may be disposed and secured within. For example, as shown in FIGS. 1A and 1B, one or more solid state storage modules (104) may be disposed within a front portion of the chassis (102).

Further, as shown, one or more openings may be formed through the chassis (102) of the storage assembly system (100), in which the one or more openings may allow airflow through the chassis (102) of the storage assembly system (100). In one or more embodiments, the aforementioned openings formed through the chassis (102) may include an upper airflow chamber (108), a central airflow chamber (110), and a lower airflow chamber (112).

Furthermore, one or more fan modules (not shown) may be disposed within one or more fan module bays (114) in a rear portion of the chassis (102). In one or more embodiments of the technology, the one or more fan modules in the one or more fan module bays (114) may be configured to pull air through the chassis (102) of the storage assembly system (100). More specifically, the fan modules may be configured to draw air from the front portion of the chassis (102) to the rear portion of the chassis (102) through each of the upper airflow chamber (108), the central airflow chamber (110), and the lower airflow chamber (112) (e.g., along the directions shown by arrows A, B, and C, respectively, in FIG. 1B). In one or more embodiments, airflows A, B and C may be isolated in each of the upper airflow chamber (108), the central airflow chamber (110), and the lower airflow chamber (112), respectively, in at least some regions. For example, in the region occupied by the solid state storage modules (104), the airflow in the central airflow chamber (110) is separated from the airflows of upper and lower airflow chambers (108, 112). Accordingly, the solid state storage modules may be exposed solely to airflow in the central airflow chamber. In one or more embodiments, the central airflow chamber may form a channel for air to be moved from the front portion of the chassis to the back portion of the chassis by the fan modules. The channel may be formed by a set of air guide panels. The solid state storage modules (104), when inserted into the chassis (102) may be oriented vertically (see FIG. 1B), and may extend substantially from an air guide panel forming a bottom of the channel to an air guide panel forming a ceiling of the channel. Airflow is therefore limited to the gaps (118) between the solid state storage modules, and, in case of the outermost solid state storage modules, the gaps between the solid state storage modules and adjacent air guide panels.

Moreover, in one or more embodiments, the storage assembly system (100) may also include one or more power supplies (not shown). In one or more embodiments of the technology, the one or more power supplies may supply power and may also pull air through the chassis (102) of the storage assembly system (100) (e.g., through a power supply airflow chamber (116)).

Referring to FIGS. 2A-2D, multiple views of a solid state storage module (104), in accordance with one or more embodiments of the technology, are shown. The solid state storage module (104) may be disposed within the storage chassis (102). In one embodiment of the technology, the solid state storage module width (denoted as "W" in FIG. 2B) may be designed such that 36 solid state storage modules may be housed within a chassis (see e.g., FIG. 1A). The height of the solid state storage module (denoted as "H" in FIG. 2A) may be 2U (or substantially 2U). When inserted into the storage chassis (102), the solid state storage modules may extend from the bottom of the central airflow chamber (110) (e.g. an air guide panel) to the top of the central airflow chamber (e.g. another air guide panel). The technology is not limited to the aforementioned dimensions.

As shown in FIGS. 2A-2D, the solid state storage module may include a housing (202) and a pull member (204), enabling a user to insert and remove the solid state storage module from the storage chassis. In one or more embodiments, the housing (202) may include a top cover (206) and a bottom cover (208), forming a cavity. The cavity may include a printed circuit board including solid state storage (e.g., NAND Flash memory, NOR Flash memory, Magnetic RAM Memory (MRAM), Spin Torque Magnetic RAM Memory (ST-MRAM), Phase Change Memory (PCM), memristive memory, or any other memory defined as a non-volatile Storage Class Memory (SCM)), and other integrated circuit components, capacitors, etc.), mounted thereon.

In one or more embodiments of the technology, the solid state storage module also includes two 4× Peripheral Component Interconnect Express (PCIe) connectors (210A, 210B). The two 4×PCIe connectors may enable the solid state storage module to connect to other circuitry of the storage assembly system (100). The solid state storage module may be implemented with other types of connectors without departing from the technology.

In other embodiments of the technology, the solid state storage module may implement connectors that conform to one or more of the following protocols: Peripheral Component Interconnect (PCI), PCI-eXtended (PCI-X), Non-Volatile Memory Express (NVMe), Non-Volatile Memory Express (NVMe) over a PCI-Express fabric, Non-Volatile Memory Express (NVMe) over an Ethernet fabric, and Non-Volatile Memory Express (NVMe) over an Infiniband fabric. Those skilled in the art will appreciate that the technology is not limited to the aforementioned protocols.

In one or more embodiments of the technology, the integrated circuit components (not shown), including the solid state storage, may be in contact with the top cover (206) and/or the bottom cover (208), either directly or via some thermal interface material (TIM). The TIM may be a malleable material such as a silicon-based putty or gel. Other TIMs may be used without departing from the technology. The TIM, in one or more embodiments of the technology, is positioned within the solid state storage module as to limit the air gaps between the integrated circuit components within the cavity and the top and/or bottom cover (206, 208).

Further, one or more heat spreaders may be located between the top cover (206) and the TIM and/or between the bottom cover (208) and the TIM. The heat spreader(s) may be made of any material that provides efficient heat dissipation in order to prevent any hotspots on the top and/or bottom cover as a result of the heat generated by the integrated circuit components. The heat spreader(s) may be made of, for example, carbon fiber. The heat spreader may use other materials without departing from the technology.

The top and bottom covers (206, 208) of the solid state storage module (104) may be connected together by press fitting. Said another way, the top and bottom covers are pressed together to create the solid state storage module. In such cases, there are no external fasteners are used to connect the top and bottom covers of the solid state storage modules to each other. The lack of external fasteners may enable the solid state storage module to be tamper resistant. In other embodiments of the technology, the top and bottom covers may be connected together using external fasteners including, but not limited to, screws, pins, epoxy (or other adhesive chemical compounds).

In one embodiment of the technology, the top and bottom covers (206, 208) of the solid state storage module (104) are made of Aluminum. However, those skilled in the art will appreciate that they may be made of any other material that functions to (i) dissipate heat and/or (ii) shield the internal components in the solid state storage module from electromagnetic interference (EMI). In one embodiment of the technology, the top and bottom covers of the solid state storage module act as individual heat sinks and/or collectively as a single heat sink. The top and bottom covers may be made of other materials such as composites, alloys, or any other material that has high thermal conductivity. The selection of a specific material for the top and bottom cover of the solid state storage module may vary based on the amount of heat that needs to be removed from the solid state storage module. Further, while the solid state storage module is described using a single material for the top and bottom covers, the top and bottom covers of the solid state storage module may be made of different materials. Further, the materials used for a given cover may also be non-uniform such that one portion of a cover may be made of a first material and a second portion of the cover may be made of a second material.

In one or more embodiments of the technology, one or more holes in the top and/or bottom covers (206, 208) may form nozzles (212) to be used for creating an airflow substantially perpendicular to the surface of the top and bottom covers. One or more embodiments of the technology that include the one or more holes are subsequently described in FIGS. 3A-5B.

FIGS. 3A and 3B show a top view and a side view, respectively, of a solid state storage module (104) in accordance with one or more embodiments of the technology. FIG. 3B further schematically shows a fan module (300) (which may be similar to the fan module inserted into a fan module bay (114) of the chassis (102)) that is drawing air across the surfaces of the solid state storage module (206). One or more fans of the fan module, placed downstream of the solid state storage module, generate a negative pressure on the side facing the solid state storage module, resulting in an airflow (302) (from right to left in FIG. 3B) along the top and bottom covers (206, 208) of the solid state storage module (104). Alternatively or in addition, one or more fan modules may be placed upstream of the solid state storage module, generating a positive pressure on the side facing the solid state storage module. In one or more embodiments of the technology, a laminar airflow along the top and bottom covers may develop, where the flow characteristics are location-dependent. Initially, as air approaches the solid state storage module (104), the velocity of the air may be approximately similar across the entire airflow (see right-most area of FIG. 3B). Once the air passes along the top and bottom covers of the solid state storage module, friction between the stationary top and bottom covers and the moving air reduces the velocity of the airflow in the intermediate vicinity of the top and bottom covers, whereas the velocity reduction may be less significant at a greater distance from the solid state storage module. Accordingly, a parabolic or quasi-parabolic flow velocity profile (304) may develop. Due to this effect, a zone (306) may develop in the vicinity of the top and bottom covers, where air is stagnant and/or only slowly moving. Convective heat transfer in this zone may be poor, due to the stagnant and/or slowly moving air. As the air moves along the top and bottom covers (right to left, in FIG. 3B), the zone (306) may become increasingly wider and thus convective heat transfer may be further impeded. If no countermeasures are taken, the convective heat transfer may be impeded to the extent that overheating of components of the solid state storage module (104) may occur.

In one or more embodiments of the technology, the zone (306) of stagnant and/or slowly moving air is disrupted using jets of air directed from the top and bottom covers (206, 208) of the solid state storage module (104) in a direction substantially perpendicular to the airflow (302). The jets of air may originate from one or more holes (shown in FIG. 3A, but not visible in FIG. 3B) in the top and/or bottom covers (206, 208) that form nozzles (212) designed for ejecting jets of air. The jets of air, ejected by the nozzles (212) may sufficiently disturb the development of the parabolic or quasi-parabolic flow profile, for example, by generating a zone of turbulence (308) in the otherwise laminar airflow (302). As a result, the parabolic or quasi parabolic flow profile (306) is eliminated or reduced, and sufficient airflow along the top and bottom covers (206, 208) is reestablished. As the air continues moving along the top and bottom covers (right to left, in FIG. 3B), a parabolic or quasi-parabolic flow profile may reemerge, and a second zone (310) of stagnant or slow air movement may develop further downstream. Additional jets of air (not shown) may be employed to disrupt the second zone (310).

Figure 4:
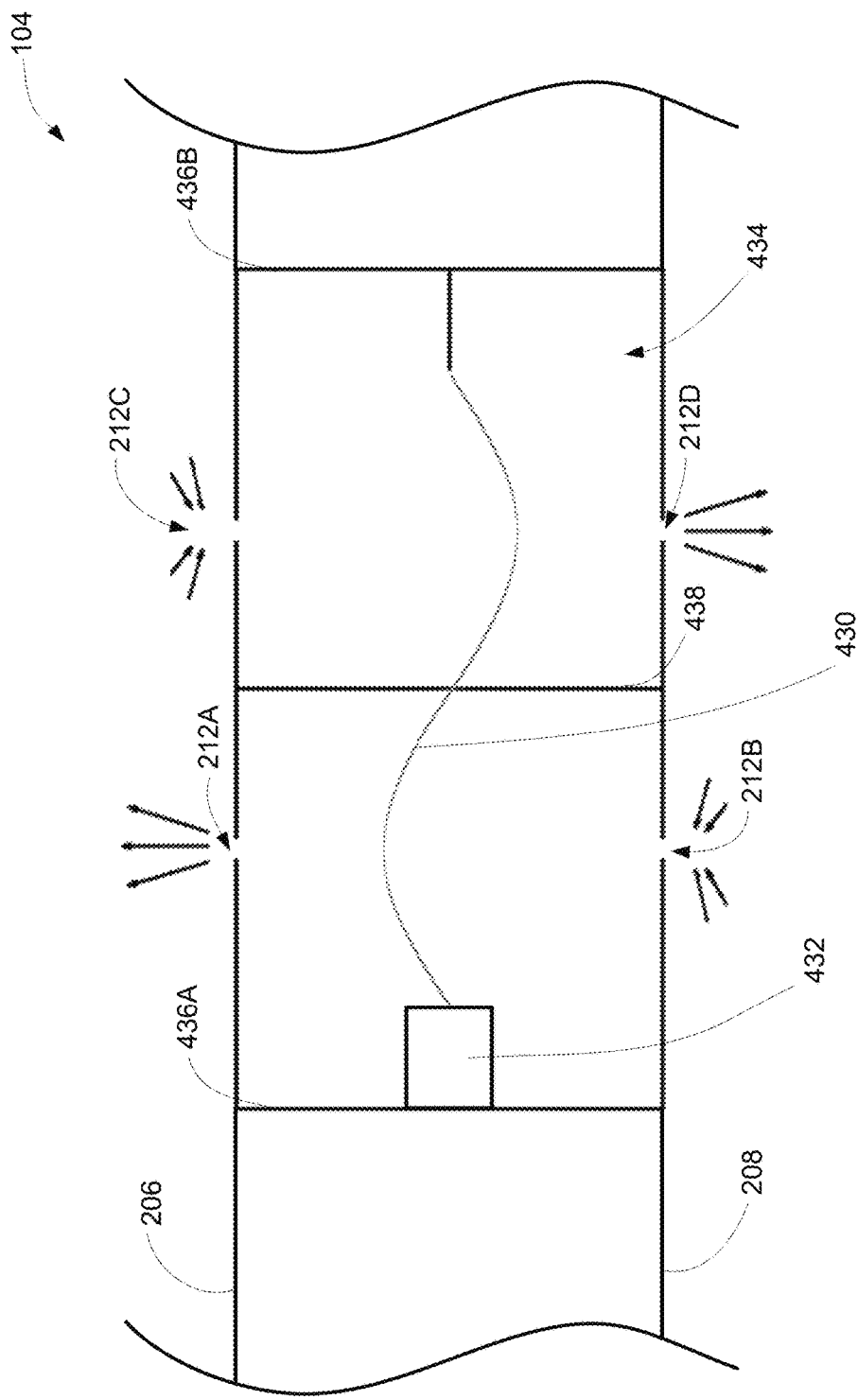
FIGS. 4-5B show detailed views of solid state storage modules in accordance with one or more embodiments of the technology.
Figure 5A:
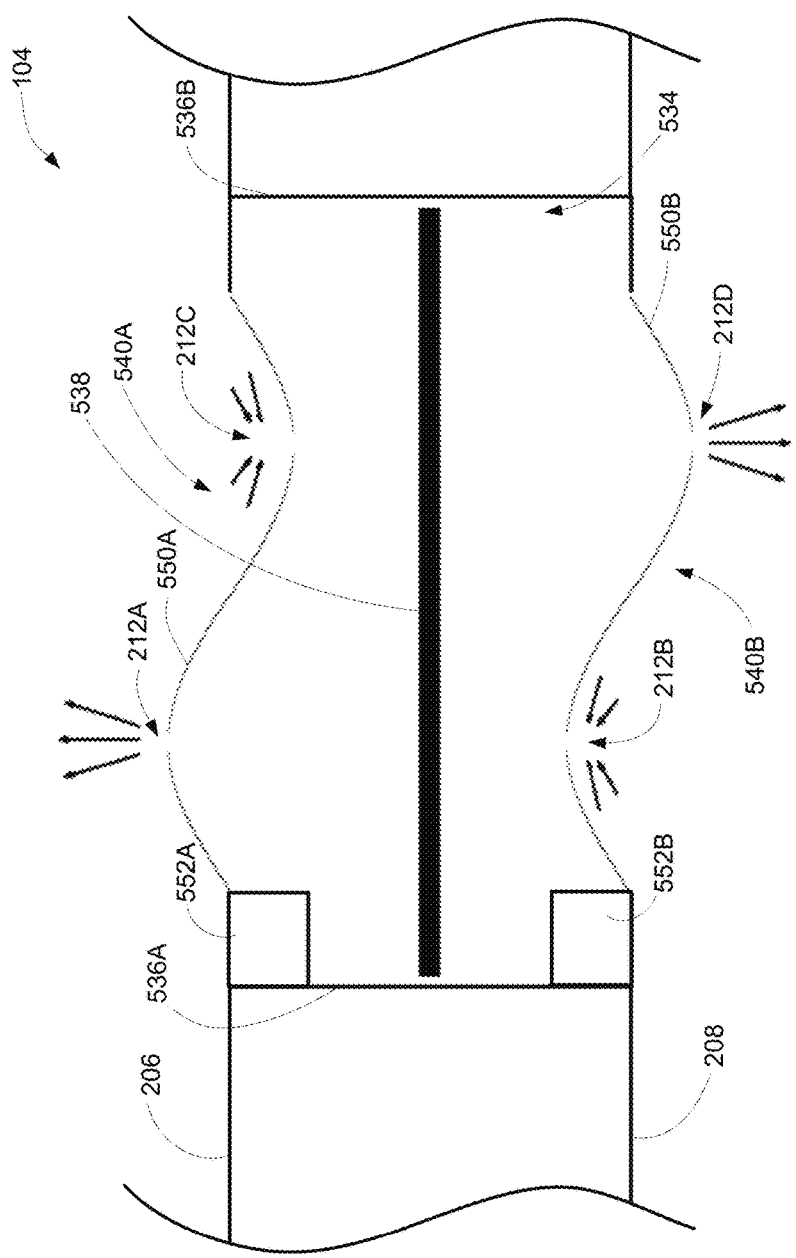
Figure 5B:
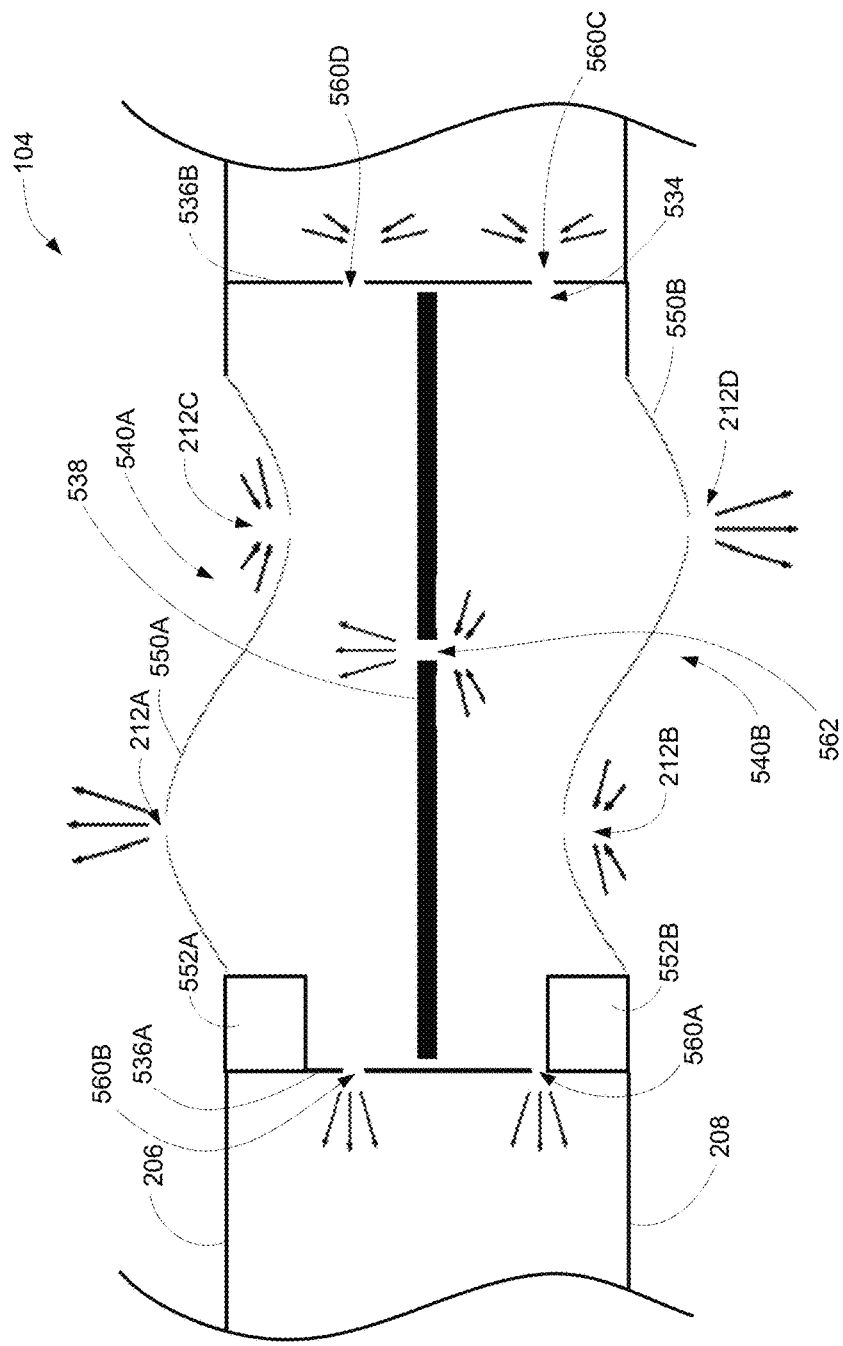

FIGS. 4-5B show detailed views of solid state storage modules in accordance with one or more embodiments of the technology, illustrating the implementation of the jets of air used to disrupt the previously described zones of stagnant or slowly moving air.

In FIG. 4, a detailed view of an exemplary embodiment of the technology is shown, where jets of air a generated by a membrane (430) located within the solid state storage module (104). The solid state storage module, in accordance with an embodiment of the technology includes top and bottom covers (206, 208). In the exemplary embodiment shown in FIG. 4, the top cover (206) is equipped with holes forming two nozzles (212A, 212B). In one embodiment of the technology, a nozzle may be the hole itself. In an alternative embodiment of the technology, a nozzle insert may be in the hole, thus forming the nozzle. The diameter of the nozzle may be determined by a need to generate a jet of air, sufficiently strong to disturb the development of the previously described parabolic or quasi-parabolic flow profiles. The diameter of the nozzle may be a tradeoff between selecting a diameter small enough to generate a jet of air of sufficient velocity, and selecting a diameter large enough to avoid excessive pressure loss due to flow resistance. The diameter of the nozzle may be, for example, 0.5 mm. Those skilled in the art will appreciate that the diameter of the nozzle is not limited to this particular dimension. Rather, the selected diameter may be determined based on multiple factors, including, but not limited to, the number of nozzles and the volume of air displaced through the nozzles. Further, the bottom cover (208) may be equipped with holes forming two nozzles (212C, 212D). Top and bottom covers (206, 208) and walls (436A, 436B) may form a cavity (434) where air may only or primarily be exchanged with the surrounding environment via the nozzles (212A-212D). The cavity is thus separated from other internal components of the solid state storage modules (104) such as printed circuit boards, solid state memory, etc. In one embodiment of the technology, the cavity is located approximately in the center of the solid state storage module in a longitudinal direction (denoted as "L" in FIG. 2A) and may extend along the entire height (denoted as "H" in FIG. 2A) of the solid state storage module (see dashed lines surrounding the nozzles (212) in FIG. 3A for an exemplary geometry of the chamber). In one embodiment of the technology, a compartment divider wall (438) divides the cavity (434) into two compartments. As previously described, the top and bottom covers (206, 208) may be made of aluminum or any other material that functions to (i) dissipate heat and/or (ii) shield the internal components in the solid state storage module from electromagnetic interference. The walls (436A, 436B) and the compartment divider wall (438) may be made of similar materials. In one embodiment of the technology, the membrane (430) further separates the compartment. The membrane may reach from one wall (436A) to the other wall (436B), across the compartment divider wall (438). Further, the membrane may extend along the entire height of the solid state storage module, thus effectively further dividing the previously described two compartments into a total of four sub-compartments. In one or more embodiments of the technology, the membrane may be a film of any size and geometry matching the geometry of the cavity. In the exemplary embodiment shown in FIG. 4, the membrane is rectangular. In other embodiments, the membrane may be square, circular, or generally of any geometry defined by the cavity. In one embodiment of the technology, the membrane is made of an air-tight material, such as paper, polyethylene terephthalate (PET), silicone, etc. If other media are used for cooling (e.g., oil or water, instead of air) the material of the membrane may be impermeable to these media. In the embodiment shown in FIG. 4, no, or only limited air exchange may be possible between the sub-compartments. Each of the sub-compartments may include at least one nozzle (212A-212D).

In one embodiment of the technology, the membrane (430) may be actuated by an actuator (432). The membrane may be actuated to oscillate as shown in FIG. 4, e.g., at a frequency where the movement pattern of the membrane is a standing wave with a node at the compartment divider wall (438). Accordingly, jets of air may be alternatingly ejected and injected through the nozzles (212A-212D). More specifically, as air enters through nozzles (212A) and (212D), air may exit through nozzles (212B) and (212C). Air may enter through a nozzle if, as a result of the membrane movement, a volume of a compartment housing the nozzle is increasing, and air may exit through a nozzle if as result of the membrane movement, the volume of the compartment housing the nozzle is decreasing. In one embodiment of the technology, the ejected and injected jets of air are sufficient to disturb the development of the previously described parabolic or quasi-parabolic flow profile.

In one embodiment of the technology, the actuator (432) causing the oscillation of the membrane (430) may be, for example, a piezoelectric, electrostatic or electromagnetic actuator, that is mechanically coupled to the membrane. The actuator may be separate, but mechanically coupled to the membrane (e.g., similar to a voice coil driving a diaphragm in a loudspeaker), or it may be integrated with the membrane (e.g., similar to electrostatic or magnetostatic loudspeakers). Those skilled in the art will appreciate that the technology is not limited to the above principles of actuating the membrane. Rather, any actuator, capable of causing the membrane to perform an oscillatory movement, may be used.

One skilled in the art will recognize that the technology is not limited to the configuration described in FIG. 4. For example, an alternative embodiment of the technology may not have a compartment separation wall. Further, the oscillation of the membrane is not necessarily a second harmonic oscillation. For example, in an embodiment without compartment separation wall, a first harmonic oscillation may be used instead. Further, for illustrative purposes, FIG. 4 shows four nozzles. However, embodiments of the technology may have any number of nozzles. For example, as shown in FIG. 3A, there may be rows of nozzles along the height of the solid state storage module. In one or more embodiments of the technology, the size and geometry of components of the air-jet-generating mechanism may be determined based on the need to generate air jets, sufficiently powerful to disturb the development of the previously described parabolic or quasi-parabolic flow profile. The volume of the cavity, the size of the membrane, the membrane oscillation frequency, the membrane oscillation amplitude, the membrane oscillation waveshape, the type of actuator, and the number of nozzles may be chosen to meet this requirement. In addition, the nozzles and/or membranes shown in FIG. 4, or other variations of the air-jet-generating mechanism, may be implemented repeatedly along the length of a solid state storage module at any location. Also, although a configuration that generates air jets on the top and the bottom side of the solid state storage module is shown in FIG. 4, alternative embodiments of the technology may only generate air jets on one side of the solid state storage module.

In FIG. 5A, a detailed view of an exemplary embodiment of the technology is shown, where jets of air are generated by membranes (550A, 550B) located on the top and bottom covers (206, 208), of the solid state storage module (104). The solid state storage module, in accordance with an embodiment of the technology includes top and bottom covers (206, 208). In the exemplary embodiment shown in FIG. 5A, the top and bottom covers (206, 208) include openings (540A, 540B). In one embodiment of the technology, the openings may be rectangular cutouts that may be located approximately in the center of the solid state storage module in a longitudinal direction (denoted as "L" in FIG. 2B) and that may extend along the entire height (denoted as "H" in FIG. 2B) of the solid state storage module. In one embodiment of the technology, the openings (540A, MOB) may be covered by membranes (550A, 550B). In one or more embodiments of the technology, the membrane may be a film of any size and geometry matching the geometry of the openings (540A, 540B). In the exemplary embodiment shown in FIG. 5A, the membrane is rectangular. In other embodiments, the membrane may be square, circular, or generally of any geometry defined by the openings. In one embodiment of the technology, the membrane is made of an air-tight material, such as paper, polyethylene terephthalate (PET), silicone, etc. If other media are used for cooling (e.g., oil or water, instead of air) the material of the membrane may be impermeable to these media.

The membranes (550A, 550B) may be equipped with holes forming four nozzles (212A-212D). Top and bottom covers (206, 208), equipped with the membranes (550A, 550B), and walls (536A, 536B) may form a cavity (534), where air may only or primarily be exchanged with the surrounding environment via the nozzles (212A-212D). In one embodiment of the technology, a circuit board (538) traverses the cavity (534), thus dividing the cavity (534) into two compartments. No, or only limited air exchange may be possible between the two compartments.

As previously described, the top and bottom covers (206, 208) and walls (536A, 536B) may be made of aluminum or any other material that functions to (i) dissipate heat and/or (ii) shield the internal components in the solid state storage module from electromagnetic interference. In one embodiment of the technology, the membranes (550A, 550B) may provide shielding from electromagnetic interference. The shielding may be provided by an electrically conductive surface, e.g., thin layers of copper, aluminum or silver on the membrane surfaces.

In one embodiment of the technology, the membranes (550A, 550B) may be actuated by two actuators (552A, 552B). The membranes may be actuated to oscillate as shown in FIG. 5A, e.g., at a frequency where the movement patterns of the membranes are standing waves with nodes at substantially the center of the membranes, as illustrated in FIG. 5A. Accordingly, jets of air may be alternatingly ejected and injected through the nozzles (212A-212D). More specifically, as air enters through nozzles (212A) and (212D), air may exit through nozzles (212B) and (212C), respectively. In one embodiment of the technology, the volume of the cavities may remain substantially constant, during an oscillation cycle. As the membrane on one side of the node of the standing wave is moving outward, causing a local volume increase, the membrane on the other side of the node is moving inward, causing a local volume decrease. Air may enter through a nozzle in the region of local volume increase, and air me exit through a nozzle in the region of local volume decrease. In one embodiment of the technology, the ejected and injected jets of air are sufficient to disturb the development of the previously described parabolic or quasi-parabolic flow profile.

In one embodiment of the technology, the actuator (552A, 552B) causing the oscillation of the membrane (550A, 550B) may be, for example, a piezoelectric, electromagnetic or electrostatic actuator, that is mechanically coupled to the membrane. The actuator may be separate, but mechanically coupled to the membrane, or it may be integrated with the membrane. Those skilled in the art will appreciate that the technology is not limited to the above principles of actuating the membrane. Rather, any actuator, capable of causing the membrane to perform an oscillatory movement, may be used. The membranes (550A, 550B) may oscillate either synchronously or asynchronously.

FIG. 5B, shows an embodiment of the technology where air exchange between the cavity (534) and the environment is not limited to inflow and outflow of air via the nozzles (212A-212D). Instead, air may also enter and exit the cavity through additional openings, for example, openings (560A-560D) in the walls (536A, 536B). Further, air exchange may be possible between the compartments separated by the printed circuit board (538), for example through an opening (562) in the circuit board. The embodiment shown in FIG. 5B is otherwise similar to the embodiment shown in FIG. 5A.

In one embodiment of the technology, the solid state memory module (104) may be designed such that an internal airflow supports the cooling of components on the printed circuit board (538). In the exemplary embodiment shown in FIG. 5B, air may enter the cavity (534) through the openings on the right side (560C, 560D) and may pass along the printed circuit board (538) and may exit the cavity (534) through the openings on the left side (560A, 560B). The airflow may be generated by a fan (for example, in a setup as shown in FIG. 3B). Air may enter the solid state memory module (104) on the upstream end of the flash module and may move inside the solid state memory, along the printed circuit board to exit the solid state memory module at the downstream end. Without countermeasures, zones of stagnant and/or only slowly moving air may develop in the vicinity of the printed circuit board, thus resulting in poor convective heat removal, as previously described. However, in the embodiment shown in FIG. 5B, the jets of air, ejected and injected via the nozzles (212A-212D) are sufficient to disturb the development of zones of stagnant and/or only slowly moving air in the vicinity of the printed circuit board. Accordingly, in the embodiment shown in FIG. 5B, zones of stagnant and/or slowly moving air may be prevented or reduced inside and outside the solid state memory module. The jets of air may be generated despite the presence of alternative pathways for air into and out of the cavity, due to inertia of the air. When the membranes (550A, 550B) oscillate, the nozzles (560A-560D) may provide a relatively low resistance pathway into and out of the cavity, and air may therefore enter and exit via the nozzles, despite the availability of alternative pathways.

In one embodiment of the technology, additional pathways, for example, through the printed circuit board may exist. In the embodiment shown in FIG. 5B, air passes from the compartment below the printed circuit board to the cavity above the printed circuit board, via the opening (562). This airflow may be a result, for example, of a pressure gradient between the two compartments. Such a pressure gradient may develop due to different configurations of the pathways for air to flow along the printed circuit board. For example, larger components on the printed circuit board may obstruct airflow, thus resulting in reduced airflow.

One skilled in the art will recognize that the technology is not limited to the configuration described in FIGS. 5A and 5B. For example, the oscillation of the membrane is not necessarily a second harmonic oscillation. Further, for illustrative purposes, FIGS. 5A and 5B show four nozzles. However, embodiments of the technology may have any number of nozzles. For example, as shown in FIG. 3A, there may be rows of nozzles along the width of the solid state storage module. In one or more embodiments of the technology, the size and geometry of components of the air-jet-generating mechanism may be determined based on the need to generate air jets, sufficiently powerful to disturb the development of the previously described parabolic or quasi-parabolic flow profile. The volume of the cavity, the size of the membrane, the membrane oscillation frequency, the membrane oscillation amplitude, the membrane oscillation waveshape, the type of actuator, and the number of nozzles may be chosen to meet this requirement. In addition, the nozzles and/or membranes shown in FIGS. 5A and 5B, or other variations of the air-jet-generating mechanism, may be implemented repeatedly along the length of a solid state storage module at any location. Also, although a configuration that generates air jets on the top and the bottom side of the solid state storage module is shown in FIGS. 5A and 5B, alternative embodiments of the technology may only generate air jets on one side of the solid state storage module. Further, the openings in addition to the nozzles are not limited to the configuration shown in FIG. 5B. Any number of openings in various locations may exist.

One skilled in the art will recognize that the technology is not limited to the configurations shown in FIGS. 4-5B. Embodiments of the technology may be employed to cool not only solid state storage modules, but any other component. Accordingly, the technology may be used in any type of heat sink or heat sink-like structure. The technology may be used for the thermal management of integrated circuits (including, for example, central processing units (CPUs), memory modules such as dynamic random-access memory (DRAM), field programmable gate arrays (FPGAs), etc.), arrays of light emitting diodes, etc. Further, the technology may also be used in different environments. For example, the surrounding medium may be air or any type of gas, but may also include liquids, such as water, oil, etc. Depending on the medium, materials and dimensions may be adjusted, without departing from the technology.

Embodiments of the technology may enable convective heat transfer. The use of air jets may prevent the buildup of zones where air (or a gaseous or liquid medium in general) is stagnant and/or only slowly moving. Accordingly the use of air jets in accordance with one or more embodiments of the technology may improve heat transfer. The technology may be employed in any kind of scenario where improved heat transfer is desirable. The technology may improve cooling over conventional convectional cooling and may, for example, reduce or eliminate the need for increasing the airflow in the area surrounding a component to be cooled.

While the technology has been described with respect to a limited number of embodiments, those skilled in the art, having benefit of this disclosure, will appreciate that other embodiments can be devised which do not depart from the scope of the technology as disclosed herein. Accordingly, the scope of the technology should be limited only by the attached claims.

What is claimed is:

1. A heat sink forming a housing that encloses an electronic component, comprising:
    a top cover pressed onto a bottom cover;
    a cavity formed between the top cover and the bottom cover,
        wherein the electronic component is disposed within and traverses the cavity to divide the cavity into a first compartment and a second compartment;
    a membrane forming at least part of a surface of the heat sink;
    a first nozzle, in the membrane, providing a first pathway from a first region of the first compartment to the surface of the heat sink;
    a second nozzle, in the membrane, providing a second pathway from a second region of the first compartment to the surface of the heat sink; and
    an actuator of the membrane, causing the membrane to oscillate,
        wherein, alternatingly, an oscillation of the membrane:
            causes inflow of a medium through the first nozzle while simultaneously causing outflow of the medium through the second nozzle; and
            causes outflow of the medium through the first nozzle while simultaneously causing inflow of the medium through the second nozzle.

2. The heat sink of claim 1, further comprising:
    a second membrane forming at least part of a second surface of the heat sink;
    a third nozzle, in the second membrane, providing a first pathway from the second compartment to the second surface of the heat sink; and
    a second actuator of the second membrane, causing the second membrane to oscillate,
    wherein an oscillation of the second membrane causes inflow and outflow of the medium through the third nozzle.

3. The heat sink of claim 2, further comprising:
    a fourth nozzle, in the second membrane, providing a second pathway from a first region of the second compartment to the second surface of the heat sink,
    wherein the third nozzle provides the first pathway from a second region of the second compartment to the second surface of the heat sink,
    wherein, alternatingly, the oscillation of the second membrane:
        causes inflow of the medium through the third nozzle while simultaneously causing outflow of the medium through the fourth nozzle; and
        causes outflow of the medium through the third nozzle while simultaneously causing inflow of the medium through the fourth nozzle.

4. The heat sink of claim 1, wherein a flow of the medium passes along the surface of the heat sink, and wherein the second nozzle is located in a direction of the flow of the medium downstream of the first nozzle.

5. The heat sink of claim 1, wherein a nozzle diameter is equal to or less than 0.5 mm.

6. The heat sink of claim 1, wherein the membrane is formed from one selected from the group consisting of paper, polyethylene terephthalate (PET), and silicone.

7. The heat sink of claim 1, wherein the membrane comprises an electrically conductive surface.

8. The heat sink of claim 1, wherein the actuator of the membrane is one selected from the group consisting of a piezoelectric actuator, an electrostatic actuator, and an electromagnetic actuator.

9. The heat sink of claim 1, wherein the medium is air.

10. The heat sink of claim 1, wherein the electronic component is a solid state memory module.

11. The heat sink of claim 1,
    wherein a volume of the first compartment, when the membrane is oscillating, remains substantially constant;
    wherein, alternatingly:
        the first region of the first compartment increases in volume via the inflow of the medium through the first nozzle, while simultaneously the second region of the first compartment decreases in volume via the outflow of the medium through the second nozzle, and
        the first region of the first compartment decreases in volume via the outflow of the medium through the first nozzle, while simultaneously the second region of the first compartment increases in volume via the inflow of the medium through the second nozzle.

12. The heat sink of claim 1, further comprising at least two openings different from the first nozzle and the second nozzle,
    wherein the at least two openings enable a flow of the medium, different from the inflow and outflow of the medium through the first nozzle and the second nozzle, through the first compartment.

13. The heat sink of claim 3,
    wherein a volume of the second compartment, when the second membrane is oscillating, remains substantially constant;
    wherein, alternatingly:
        the second region of the second compartment increases in volume via the inflow of the medium through the third nozzle, while simultaneously the first region of the second compartment decreases in volume via the outflow of the medium through the fourth nozzle, and
        the second region of the second compartment decreases in volume via the outflow of the medium through the third nozzle, while simultaneously the first region of the second compartment increases in volume via the inflow of the medium through the fourth nozzle.

14. A heat sink forming a housing that encloses an electronic component, comprising:
    a top cover pressed onto a bottom cover;
    a cavity formed between the top cover and the bottom cover;
    a membrane inside the cavity and segmenting the cavity into a first compartment and a second compartment;
    a first nozzle in the top cover and providing a first pathway from the first compartment to a surface of the heat sink;
    a second nozzle in the bottom cover and providing a second pathway from the second compartment to a second surface of the heat sink; and an actuator of the membrane, causing the membrane to oscillate,
   wherein, alternatingly, an oscillation of the membrane:
      causes inflow of a medium through the first nozzle while simultaneously causing outflow of the medium through the second nozzle; and
      causes outflow of the medium through the first nozzle while simultaneously causing inflow of the medium through the second nozzle.

15. The heat sink of claim 14,
wherein, alternatingly:
   the first compartment increases in volume via the inflow of the medium through the first nozzle, while simultaneously the second compartment decreases in volume via the outflow of the medium through the second nozzle, and
   the first compartment decreases in volume via the outflow of the medium through the first nozzle, while simultaneously the second compartment increases in volume via the inflow of the medium through the second nozzle.

16. The heat sink of claim 14, further comprising:
a compartment divider wall disposed between the top and bottom covers and perpendicular to the membrane,
   wherein the compartment divider wall segments the first compartment into a first sub-compartment and a second sub-compartment, and segments the second compartment into a third sub-compartment and a fourth sub-compartment,
wherein the membrane, when oscillating, alternatively increases the volumes of a first pair of compartments and decreases the volumes of a second pair of compartments.

* * * * *